(12) United States Patent
Goin et al.

(10) Patent No.: US 11,074,807 B2
(45) Date of Patent: Jul. 27, 2021

(54) REMOTE THREE-WAY SWITCH

(71) Applicants: George Goin, Selma, AL (US); Lily Appleby, Selma, AL (US)

(72) Inventors: George Goin, Selma, AL (US); Lily Appleby, Selma, AL (US)

( * ) Notice: Subject to any disclaimer, the term of this patent is extended or adjusted under 35 U.S.C. 154(b) by 0 days.

(21) Appl. No.: 16/458,344

(22) Filed: Jul. 1, 2019

(65) Prior Publication Data
US 2020/0013278 A1 Jan. 9, 2020

Related U.S. Application Data

(60) Provisional application No. 62/693,558, filed on Jul. 3, 2018.

(51) Int. Cl.
*H01H 9/02* (2006.01)
*H01H 9/54* (2006.01)
(Continued)

(52) U.S. Cl.
CPC ........... *G08C 17/02* (2013.01); *H01H 9/0271* (2013.01); *H01H 21/36* (2013.01); *H02B 1/42* (2013.01); *H03K 19/0175* (2013.01); *E05Y 2400/856* (2013.01); *H01H 21/30* (2013.01); *H01H 2221/078* (2013.01); *H01H 2221/088* (2013.01); *H03K 2217/94089* (2013.01); *H03K 2217/96015* (2013.01)

(58) Field of Classification Search
CPC .... G08C 17/02; G08C 19/28; G08C 2201/62; H05B 37/0272; H05B 37/0209; H05B 39/088; H02J 13/0079; H02J 3/14; H02J 13/00004; H02J 13/00007; H02J 13/0006; H02J 2310/12; H02J 2310/14; Y02B 70/3225; Y02B 70/3266; Y02B 90/2615; Y02B 90/20; Y04S 20/222; Y04S 20/242; Y04S 40/121; Y04S 20/14; Y10S 323/904; Y10T 307/766; Y10T 307/406; H01H 21/30; H01H 21/36; H01H 2300/03; H01H 23/02; H01H 9/0271; H01H 2221/078; H01H 2221/088; E05Y 2400/856; H02B 1/42; H03K 2217/96015; H03K 2217/94089; H03K 19/0175
See application file for complete search history.

(56) References Cited

U.S. PATENT DOCUMENTS 3,971,028 A * 7/1976 Funk ..................... G08C 17/02
307/157
5,066,898 A 11/1991 Miller et al.
(Continued)

*Primary Examiner* — Dionne Pendleton
(74) *Attorney, Agent, or Firm* — Boudwin Intellectual Property; Daniel Boudwin

(57) ABSTRACT

A remote three-way switch. The remote three-way switch includes an actuator configured to actuate a mechanical switch, such as a light switch, according to a signal received from a remote control in wireless communication with the actuator. The signal received directs the actuator to mechanically actuate the switch from an on position to an off position, or from the off position to the on position. The remote three-way switch is portable, easy to install and uninstall, and is configured to assist an individual with operating the switch from a distance. The remote three-way switch may also be configured to be permanently installed into a wall, such that it appears like an ordinary light switch after installation.

10 Claims, 3 Drawing Sheets

(51) Int. Cl.
   *G08C 17/02*      (2006.01)
   *H01H 21/36*      (2006.01)
   *H02B 1/42*       (2006.01)
   *H03K 19/0175*    (2006.01)
   *H01H 21/30*      (2006.01)

(56) References Cited

U.S. PATENT DOCUMENTS

| | | |
|---|---|---|
| 5,867,017 A | 2/1999 | Merwin et al. |
| 7,656,308 B2 | 2/2010 | Atkins |
| 8,766,770 B2 * | 7/2014 | Bassali .............. G07C 9/00182 |
| | | 340/5.64 |
| 10,587,147 B2 * | 3/2020 | Carmen, Jr. ............ H02J 50/10 |
| 2007/0176788 A1 * | 8/2007 | Mor ........................ G08C 17/02 |
| | | 340/13.24 |
| 2008/0309253 A1 | 12/2008 | Guanrong et al. |
| 2009/0251280 A1 * | 10/2009 | Marchetto .............. G08C 17/02 |
| | | 340/5.7 |
| 2019/0131082 A1 * | 5/2019 | Li ......................... H01H 9/0271 |

\* cited by examiner

REMOTE THREE-WAY SWITCH

CROSS REFERENCE TO RELATED APPLICATIONS

This application claims priority under 35 U.S.C. § 119(e) to U.S. Provisional Application No. 62/693,558 filed on Jul. 3, 2018. The above identified patent application is incorporated by reference herein in its entirety to provide continuity of disclosure.

BACKGROUND OF THE INVENTION

The present invention relates to a remote three-way switch for remotely controlling a mechanical switch, such as a light switch.

Manually operating a mechanical light switch can be difficult in the dark, particularly when a room containing the mechanical light switch has an obstacle that impedes movement to the light switch. In such circumstances, it may be desirable to have three-way switch circuitry to facilitate control of the light switch. However, many structures, such as older houses, do not have three-way switch circuitry, and installing three-way switch circuitry can be cost-prohibitive and overly complicated.

Therefore, there is a need in the art for a remote three-way switch device that allows an individual to operate the light switch from a distance, without a need for installing three-way switch circuitry. The present invention addresses this unmet need.

Devices have been disclosed in the art that relate to three-way switches. These include devices that have been patented and published in patent application publications. These devices are often inconvenient to install, uninstall, or use. In view of the devices disclosed in the art, it is submitted that there is a need in the art for an improvement to existing three-way switches. In view of the present disclosure, it is submitted that the present invention substantially diverges in structural and functional elements from devices in the art, and substantially fulfills an unmet need in the art.

SUMMARY OF THE INVENTION

In view of the disadvantages inherent in the known types of three-way switches in the art, the present invention provides a new and improved remote three-way switch, wherein the same can be remotely utilized for actuating a switch to which it is installed.

It is therefore an object of the present invention to provide a remote three-way switch for remotely actuating a mechanical switch, such as a light switch, using an actuator assembly.

In one aspect, the invention provides a remote three-way switch, comprising an actuator assembly and a wireless receiver in operable communication with the actuator assembly, wherein the actuator assembly is configured to actuate a switch upon receipt of a wireless signal by the wireless receiver.

Another object of the present invention is to provide a remote three-way switch that may be readily manufactured from materials that permit relative economy and are commensurate with durability.

Other objects, features and advantages of the present invention will become apparent from the following detailed description taken in conjunction with the accompanying drawings.

BRIEF DESCRIPTIONS OF THE DRAWINGS

Although the characteristic features of the invention will be particularly pointed out in the claims, the invention itself and manners in which it may be made and used may be better understood after a review of the following description, taken in connection with the accompanying drawings, wherein like numeral annotations are provided throughout.

DETAILED DESCRIPTION OF THE INVENTION

Figure 1:
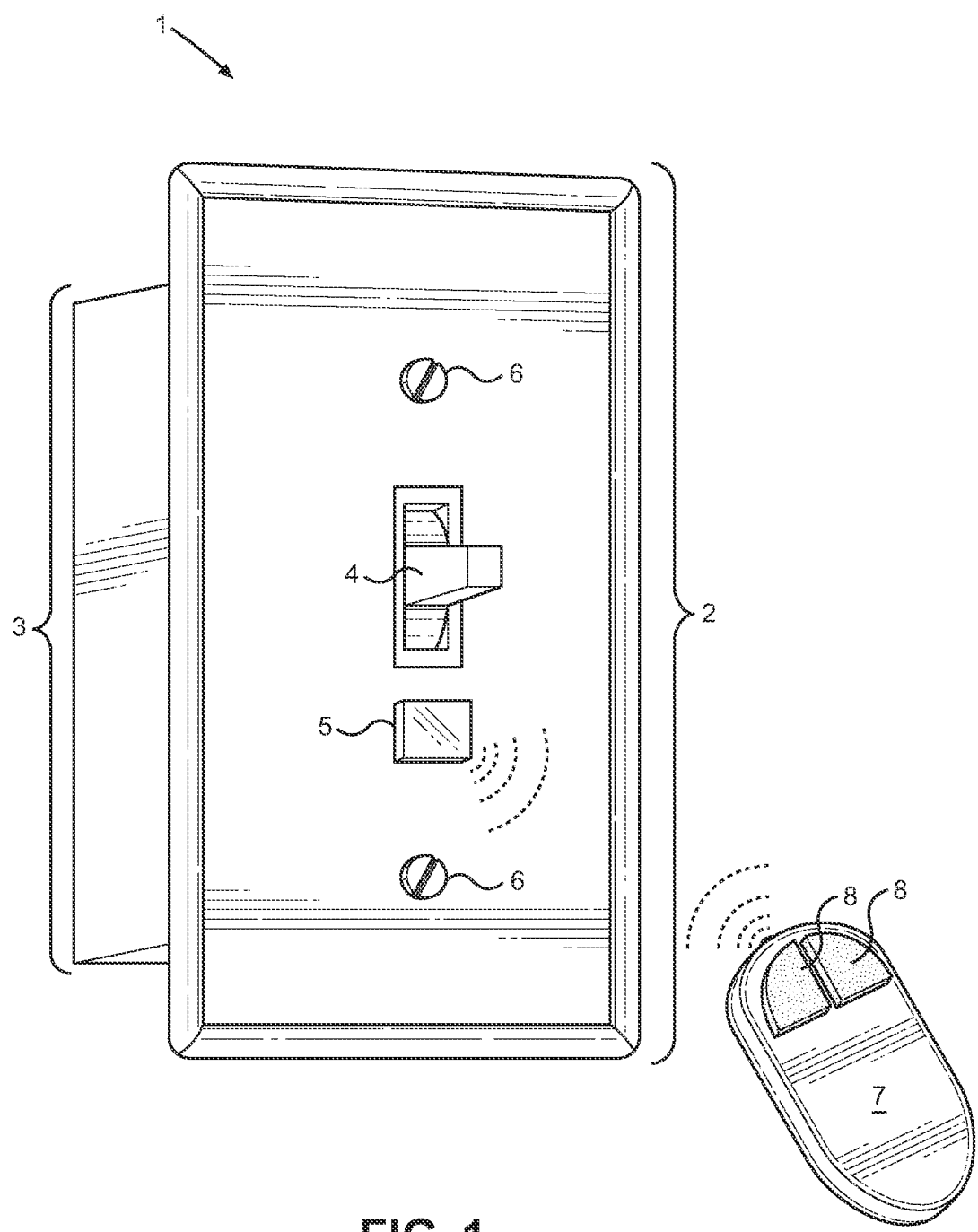
FIG. 1 depicts a front right perspective view of an exemplary remote three-way switch.

Reference is made herein to the attached drawings. Like reference numerals are used throughout the drawings to depict like or similar elements of the invention. The figures are intended for representative purposes only and should not be considered limiting in any respect.

Reference is now made to the drawings, which depict one or more exemplary embodiments of the invention.

Figure 2:
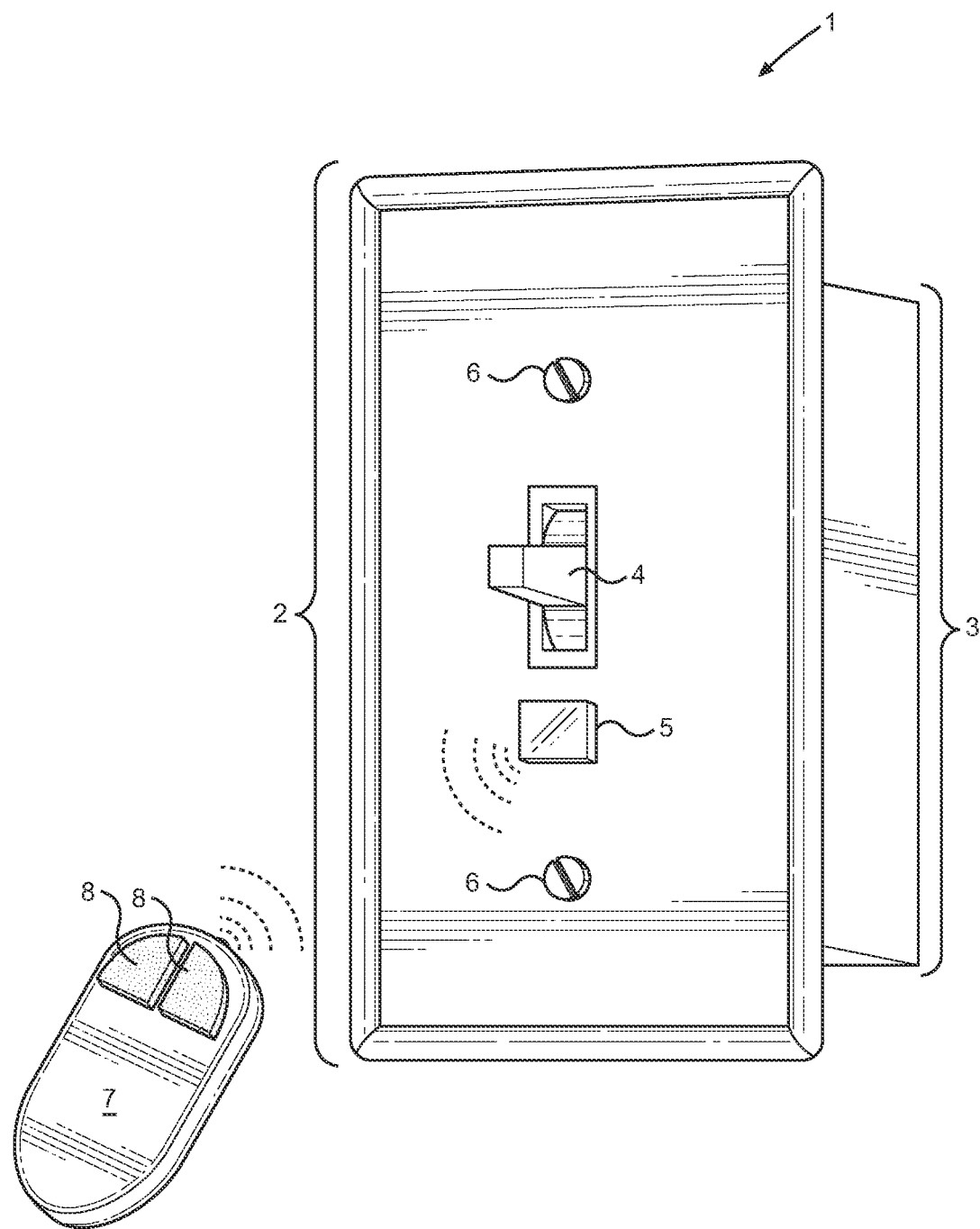
FIG. 2 depicts a front left perspective view of the exemplary remote three-way switch.
Figure 3:
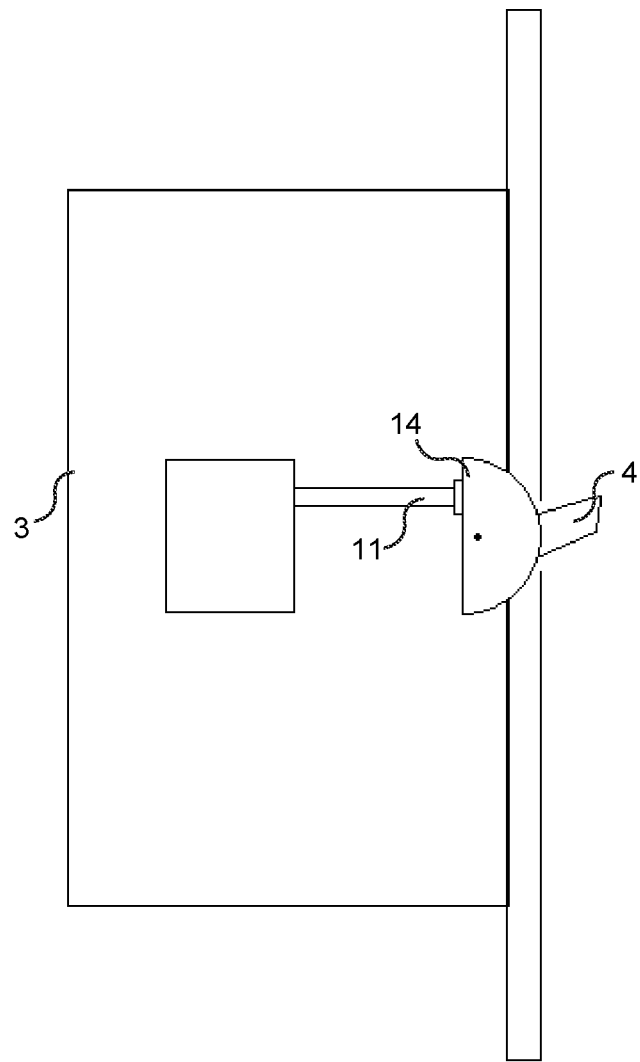
FIG. 3 depicts a cross-sectional side view of the exemplary remote three-way switch.

Referring now to FIGS. 1-3, there are depicted multiple views of an exemplary remote three-way switch. A remote three-way switch 1 includes an actuator assembly 3 and a wireless receiver 5 in operable communication with the actuator assembly 3, such that the actuator assembly 3 is configured to actuate a switch 4 upon receipt of a wireless signal by the wireless receiver 5. In the shown embodiment, and as shown in FIG. 3, the switch 4 may be actuated by application of a force 11 by the actuator assembly 3 to a rearward portion 14 of the switch 4. In addition, in the shown embodiment, the switch 4 may be actuated independent of an actuation of the actuator assembly 3, for example, by applying a force to a forward portion of the switch 4. In this manner, the switch 4 may be operated by directly and physically switching the switch 4 per ordinary usage, and may also be remotely operated, as described elsewhere herein.

The remote three-way switch 1 includes a forward plate 2 attached on a rearward side thereof to the actuator assembly 3. In the shown embodiment, the forward plate 2 includes a standard light switch plate, and also includes a pair of apertures configured to secure the actuator assembly 3 to the forward plate 2 via a pair of fasteners 6. The remote three-way switch 1 may be secured to a wall, for example, a drywall, by way of any suitable attachment means, including but not limited to a tape, an adhesive, a caulk, a fastener, a screw, a nut and bolt, a clamp, and the like. The actuator assembly 3 is insertable into the wall, and in this manner the forward plate 2 is flush or nearly flush with the wall upon installation. The attachment means may be permanent or reversible. If the attachment means is reversible, the remote three-way switch 1 may easily be removed from the wall after use, for example, if an owner moves to a different location. In this manner, the remote three-way switch 1 may be repeatedly installed and uninstalled according to need.

In addition to being directly operable, the remote three-way switch 1 is remotely operable. Upon receipt of the wireless signal by the wireless receiver 5, the actuator assembly 3 either actuates the electric switch 4 from an on position to an off position, or actuates the electric switch 4 from the off position to the on position. In some embodiments, a first encoding of the wireless signal directs the actuator assembly 3 to actuate the electric switch 4 from the on position to the off position, and a second encoding of the wireless signal directs the actuator assembly 3 to actuate the electric switch 4 from the off position to the on position. The wireless signal may include one or more signals selected from a group including, but not limited to: a Wi-Fi signal, a Bluetooth signal, an infrared signal, a radio signal, and a combination thereof.

The remote three-way switch includes a wireless transmitter 7 configured to send the wireless signal to the wireless receiver 5 upon an input from an individual operating the wireless transmitter 7. In the shown embodiment, the wireless transmitter 7 is powered by a battery included therein. In this manner, the wireless transmitter 7 may be used for an extended period of time, and may be moved or positioned around a space so as to enable the individual to operate the remote three-way switch 1 from any distance capable according to the nature of the wireless signal.

In the shown embodiment, the wireless transmitter 7 includes a standalone wireless transmitter with a dedicated housing and a pair of button controls 8. In alternate embodiments, the wireless transmitter 7 includes a different device, such as a computer, a mobile phone, a smart phone, a tablet, a smart watch, and the like. In such embodiments, one or more methods for controlling the wireless signal includes, but is not limited to: a voice or audio command, a software application, a timer, a touchscreen device, and the like. In this manner, the remote three-way switch 1 may be integrated with other technologies and solutions for home controls without the need for rewiring any circuitry for the switch 4.

The foregoing descriptions of specific embodiments of the present invention have been presented for purposes of illustration and description. They are not intended to be exhaustive or to limit the present invention to the precise forms disclosed, and modifications and variations are possible in view of the above teaching. The exemplary embodiment was chosen and described to best explain the principles of the present invention and its practical application, to thereby enable others skilled in the art to best utilize the present invention and its embodiments with modifications as suited to the use contemplated.

It is therefore submitted that the present invention has been shown and described in the most practical and exemplary embodiments. It should be recognized that departures may be made which fall within the scope of the invention. With respect to the description provided herein, it is submitted that the optimal features of the invention include variations in size, materials, shape, form, function and manner of operation, assembly, and use. All structures, functions, and relationships equivalent or essentially equivalent to those disclosed are intended to be encompassed by the present invention.

We claim:

1. A remote three-way switch, comprising:
   an actuator assembly disposed within a housing such that the actuator assembly is in contact with a rearward portion of a manual switch, and a wireless receiver in operable communication with the actuator assembly;
   wherein the housing is secured within a wall surface behind a forward plate, such that the housing and the actuator assembly is concealed from view when installed;
   wherein the actuator assembly physically operates the manual switch by an application of force from the actuator assembly to the rearward portion of the manual switch such that the manual switch moves from a first position to a second position to selectively open or close existing relays associated with the manual switch; and
   wherein the actuator assembly is configured to actuate a switch upon receipt of a wireless signal by the wireless receiver.

2. The remote three-way switch of claim 1, wherein the switch may be actuated independent of an actuation of the actuator assembly.

3. The remote three-way switch of claim 1, whereupon receipt of the wireless signal by the wireless receiver, the actuator assembly either actuates the electric switch from an on position to an off position, or actuates the electric switch from the off position to the on position.

4. The remote three-way switch of claim 1, wherein a first encoding of the wireless signal directs the actuator assembly to actuate the electric switch from an on position to an off position, wherein a second encoding of the wireless signal directs the actuator assembly to actuate the electric switch from the off position to the on position.

5. The remote three-way switch of claim 1, wherein the wireless signal includes one or more signals selected form a group consisting of: a Wi-Fi signal, a Bluetooth signal, an infrared signal, and a combination thereof.

6. The remote three-way switch of claim 1, further comprising a wireless transmitter, wherein the wireless transmitter is configured to send the wireless signal to the wireless receiver upon an input from an individual.

7. The remote three-way switch of claim 6, wherein the wireless transmitter is powered by a battery included therein.

8. The remote three-way switch of claim 1, wherein the forward plate is attachable to the wall surface by one or more attachment means selected from a group consisting of: a fastener, an adhesive, a tape adhesive, a glue adhesive, and a combination thereof.

9. The remote three-way switch of claim 1, wherein the forward plate is disposed flush with the wall surface when secured thereto.

10. A remote three-way switch, consisting of:
    an actuator assembly disposed within a housing such that the actuator assembly is in contact with a rearward portion of a manual switch, and a wireless receiver in operable communication with the actuator assembly;
    wherein the housing is secured within a wall surface behind a forward plate, such that the housing and the actuator assembly is concealed from view when installed;
    wherein the actuator assembly physically operates the manual switch by an application of force from the actuator assembly to the rearward portion of the manual switch such that the manual switch moves from a first position to a second position to selectively open or close existing relays associated with the manual switch; and
    wherein the actuator assembly is configured to actuate a switch upon receipt of a wireless signal by the wireless receiver.

* * * * *